United States Patent
Titus

(10) Patent No.: US 12,363,854 B2
(45) Date of Patent: Jul. 15, 2025

(54) SOLID-STATE CIRCUIT BREAKER WITH A VENTILATION SYSTEM THAT USES MULTI-LAYERED COVERS TO VENTILATE FOR COOLING

(71) Applicant: Siemens Industry, Inc., Alpharetta, GA (US)

(72) Inventor: Solomon R. Titus, Cumming, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 560 days.

(21) Appl. No.: 17/817,387

(22) Filed: Aug. 4, 2022

(65) Prior Publication Data
US 2024/0049419 A1   Feb. 8, 2024

(51) Int. Cl.
*H05K 7/20* (2006.01)
*H05K 5/02* (2006.01)
*H05K 5/03* (2006.01)

(52) U.S. Cl.
CPC ....... *H05K 7/20009* (2013.01); *H05K 5/0213* (2013.01); *H05K 5/03* (2013.01)

(58) Field of Classification Search
None
See application file for complete search history.

(56) References Cited

U.S. PATENT DOCUMENTS

2011/0273844 A1   11/2011   Rivera Hernandez et al.
2022/0037230 A1 *  2/2022   Yang .................... H01L 23/467

FOREIGN PATENT DOCUMENTS

| CN | 212570885 U | * | 2/2021 | ............. H01H 71/02 |
| CN | 214068658 U | * | 8/2021 | ............. H01H 71/00 |
| EP | 2385753 A2 |   | 11/2011 | |

OTHER PUBLICATIONS

CN 212570885 U, English translation (Year: 2021).*
CN 214068658 U, English translation (Year: 2021).*

* cited by examiner

*Primary Examiner* — Mukundbhai G Patel

(57) ABSTRACT

A solid-state circuit breaker or a residential circuit breaker includes a base housing semiconductors, electronics and advanced software algorithms. The base has a first profile area. It further includes a ventilation system for cooling the solid-state circuit breaker. The ventilation system includes a main cover configured to be mounted on the base by covering the first profile area of the base. The main cover has a second profile area such that the second profile area has an array of holes built-in the main cover. The ventilation system further includes an outer cover configured to be mounted on the main cover by covering the second profile area of the main cover to form an assembly of multi-layered covers. The outer cover has a third profile area such that the third profile area has an array of ribs built-in the outer cover.

20 Claims, 3 Drawing Sheets

SOLID-STATE CIRCUIT BREAKER WITH A VENTILATION SYSTEM THAT USES MULTI-LAYERED COVERS TO VENTILATE FOR COOLING

BACKGROUND

1. Field

Aspects of the present invention generally relate to a solid-state circuit breaker with a ventilation system that uses multi-layered covers to ventilate for cooling the solid-state circuit breaker.

2. Description of the Related Art

Circuit breakers are essential for electrical safeties. They feed current to loads that are connected to them and interrupt the circuit once a circuit fault such as an overload, a short circuit, a ground fault and an arc fault is detected. Due to the nature of carrying current heat is generated inside circuit breakers and this is especially significant for solid state-based circuit breakers. To ensure safe operations of circuit breakers, proper cooling is necessary as overheating of working electronics within an assembly can occur. In the past, single lines of channels are used to ventilate an assembly.

For solid state circuit breakers, direct cooling components such as heat pipes and heat sinks are normally used for thermal management. Natural convection is not normally considered to the best of knowledge.

Therefore, there is a need for a better thermal management in a circuit breaker.

SUMMARY

Briefly described, aspects of the present invention relate to a solid-state circuit breaker with a ventilation system that uses multi-layered covers to ventilate for cooling the solid-state circuit breaker when overheating of working electronics within an assembly occurs. Use of natural convection is considered. Natural convection is a mechanism of heat transportation in which the fluid motion is not generated by an external source. Instead the fluid motion is caused by buoyancy, the difference in fluid density occurring due to temperature gradients.

In accordance with one illustrative embodiment of the present invention, a solid-state circuit breaker comprises a base housing semiconductors, electronics and advanced software algorithms that control power and can interrupt extreme currents faster than traditional moving parts of an electromechanical circuit breaker. The base has a first profile area. The solid-state circuit breaker further comprises a ventilation system for cooling the solid-state circuit breaker. The ventilation system includes a main cover configured to be mounted on the base by covering the first profile area of the base. The main cover has a second profile area such that the second profile area has an array of holes built-in the main cover in that the array of holes facing perpendicular to a side plane of the solid-state circuit breaker. The ventilation system further includes an outer cover configured to be mounted on the main cover by covering the second profile area of the main cover to form an assembly of multi-layered covers. The outer cover has a third profile area such that the third profile area has an array of ribs built-in the outer cover in that the array of ribs facing an outer plane of the solid-state circuit breaker. The solid-state circuit breaker is configured to be installed in a panel of electronic circuit breakers each having a corresponding ventilation system such that ventilation per electronic circuit breaker mitigates the effect of heat from neighboring circuit breakers further thereby reducing concentration of heat within a residential panel. The neighboring circuit breakers can be either fully electronic or hybrid or mechanical only.

In accordance with one illustrative embodiment of the present invention, a residential circuit breaker comprises a base housing electronics and circuits rated either 15 amps or 20 amps. The base has a first profile area. The residential circuit breaker further comprises a ventilation system for cooling the residential circuit breaker. The ventilation system includes a main cover configured to be mounted on the base by covering the first profile area of the base. The main cover has a second profile area such that the second profile area has an array of holes built-in the main cover in that the array of holes facing perpendicular to a side plane of the residential circuit breaker. The ventilation system further includes an outer cover configured to be mounted on the main cover by covering the second profile area of the main cover to form an assembly of multi-layered covers. The outer cover has a third profile area such that the third profile area has an array of ribs built-in the outer cover in that the array of ribs facing an outer plane of the residential circuit breaker. The residential circuit breaker is configured to be installed in a panel of electronic circuit breakers each having a corresponding ventilation system such that ventilation per electronic circuit breaker mitigates the effect of heat from neighboring electronic circuit breakers further thereby reducing concentration of heat within a residential panel. The neighboring circuit breakers can be either fully electronic or hybrid or mechanical only.

In accordance with one illustrative embodiment of the present invention, a method of cooling an electronic circuit breaker being a solid-state circuit breaker is provided. The method comprises providing a base housing semiconductors, electronics and advanced software algorithms that control power and can interrupt extreme currents faster than traditional moving parts of an electromechanical circuit breaker. The base has a first profile area. The method further comprises providing a ventilation system for cooling the solid-state circuit breaker. The ventilation system includes a main cover configured to be mounted on the base by covering the first profile area of the base. The main cover has a second profile area such that the second profile area has an array of holes built-in the main cover in that the array of holes facing perpendicular to a side plane of the solid-state circuit breaker. The ventilation system further includes an outer cover configured to be mounted on the main cover by covering the second profile area of the main cover to form an assembly of multi-layered covers. The outer cover has a third profile area such that the third profile area has an array of ribs built-in the outer cover in that the array of ribs facing an outer plane of the solid-state circuit breaker.

The above described features and advantages, as well as others, will become more readily apparent to those of ordinary skill in the art by reference to the following detailed description and accompanying drawings. While it would be desirable to provide one or more of these or other advantageous features, the teachings disclosed herein extend to those embodiments which fall within the scope of the appended claims, regardless of whether they accomplish one or more of the above-mentioned advantages.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects.

DETAILED DESCRIPTION

Figure 1:
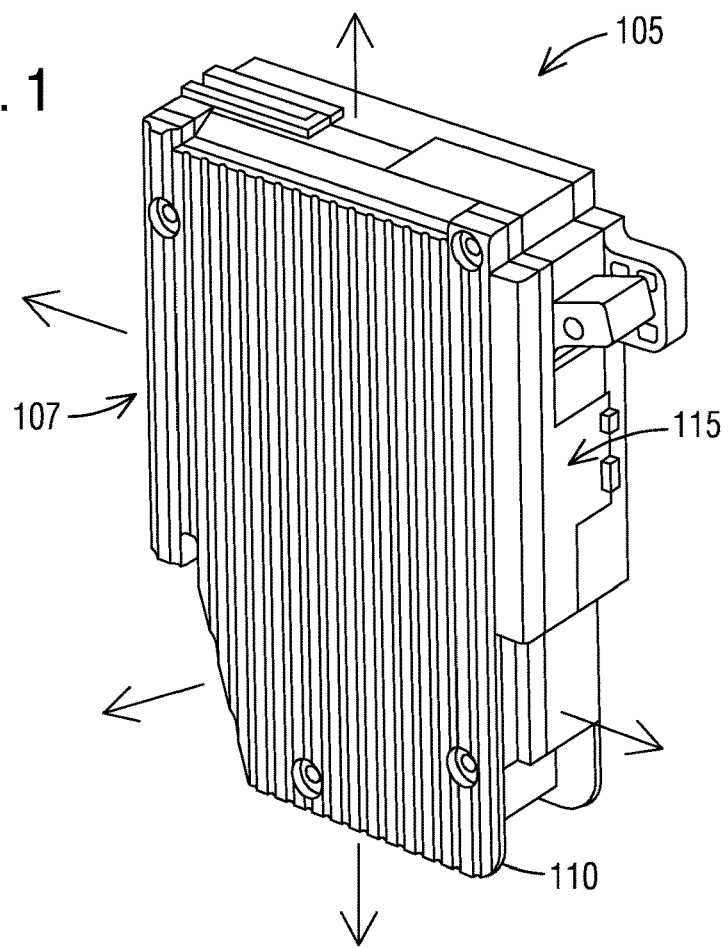
FIG. 1 illustrates a perspective view of a solid-state circuit breaker with an integrated ventilation system that uses multi-layered covers to ventilate in which a convection feature provides cooling by utilizing a full side surface area of the solid-state circuit breaker for cooling internal electronics in accordance with an exemplary embodiment of the present invention.

Various technologies that pertain to systems and methods that facilitate an integrated ventilation system for a solid-state circuit breaker will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

To facilitate an understanding of embodiments, principles, and features of the present invention, they are explained hereinafter with reference to implementation in illustrative embodiments. In particular, they are described in the context of an integrated ventilation system for a solid-state circuit breaker. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the integrated ventilation system for a solid-state circuit breaker according to the present disclosure are described below with reference to FIGS. 1-4 herein. Like reference numerals used in the drawings identify similar or identical elements throughout the several views. The drawings are not necessarily drawn to scale.

Consistent with one embodiment of the present invention, FIG. 1 represents a perspective view of a solid-state circuit breaker 105 with an integrated ventilation system 107 that uses multi-layered covers to ventilate in which a convection feature provides cooling by utilizing a full side surface 110 of the solid-state circuit breaker 105 for cooling internal electronics 115 in accordance with an exemplary embodiment of the present invention. Natural convection is a type of flow, of motion of a liquid such as water or a gas such as air, in which the fluid motion is not generated by any external source (like a pump, fan, suction device, etc.) but by some parts of the fluid been heavier than other parts. Free convection is also known as natural convection is the type of convection heat transfer in which the fluid molecules move due to the density and temperature gradient to transfer the heat.

Figure 2:
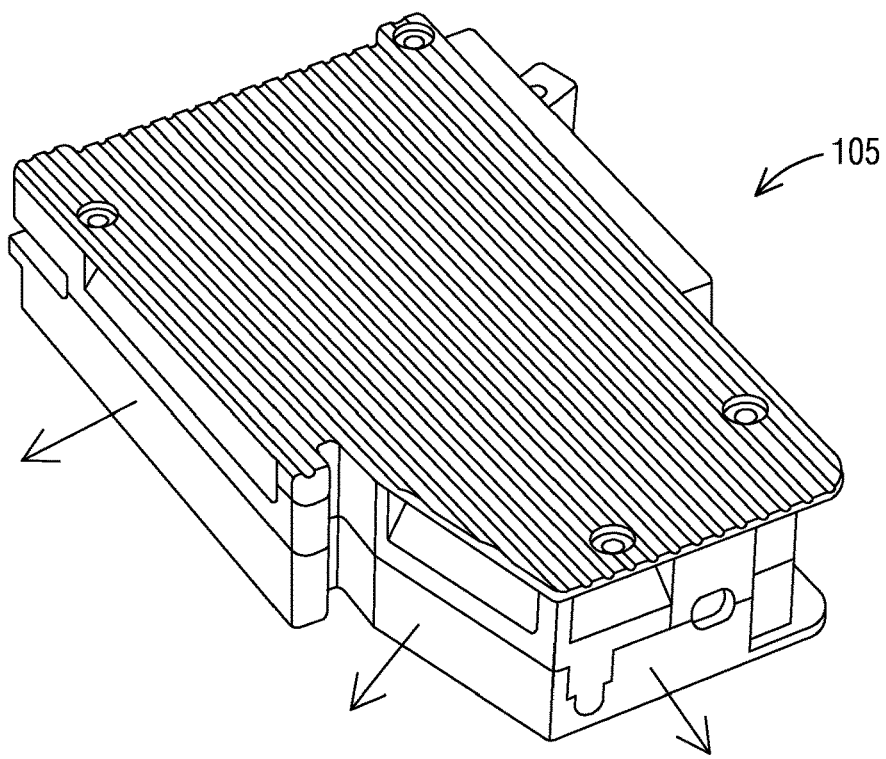
FIG. 2 illustrates another perspective view of a solid-state circuit breaker with an integrated ventilation system in accordance with an exemplary embodiment of the present invention.

Referring to FIG. 2, it illustrates another perspective view of the solid-state circuit breaker 105 with the integrated ventilation system 107 in accordance with an exemplary embodiment of the present invention. The solid-state circuit breaker 105 may be a residential circuit breaker rated for circuits rated either 15 amps or 20 amps.

For the solid-state circuit breaker 105 direct cooling is used for thermal management via natural convection. This ensures safe operations of the solid-state circuit breaker 105 as proper cooling is provided since overheating of working electronics within an assembly can occur. Substantially the entire surface area of the assembly is utilized for maximum cooling efficiency.

Figure 3:
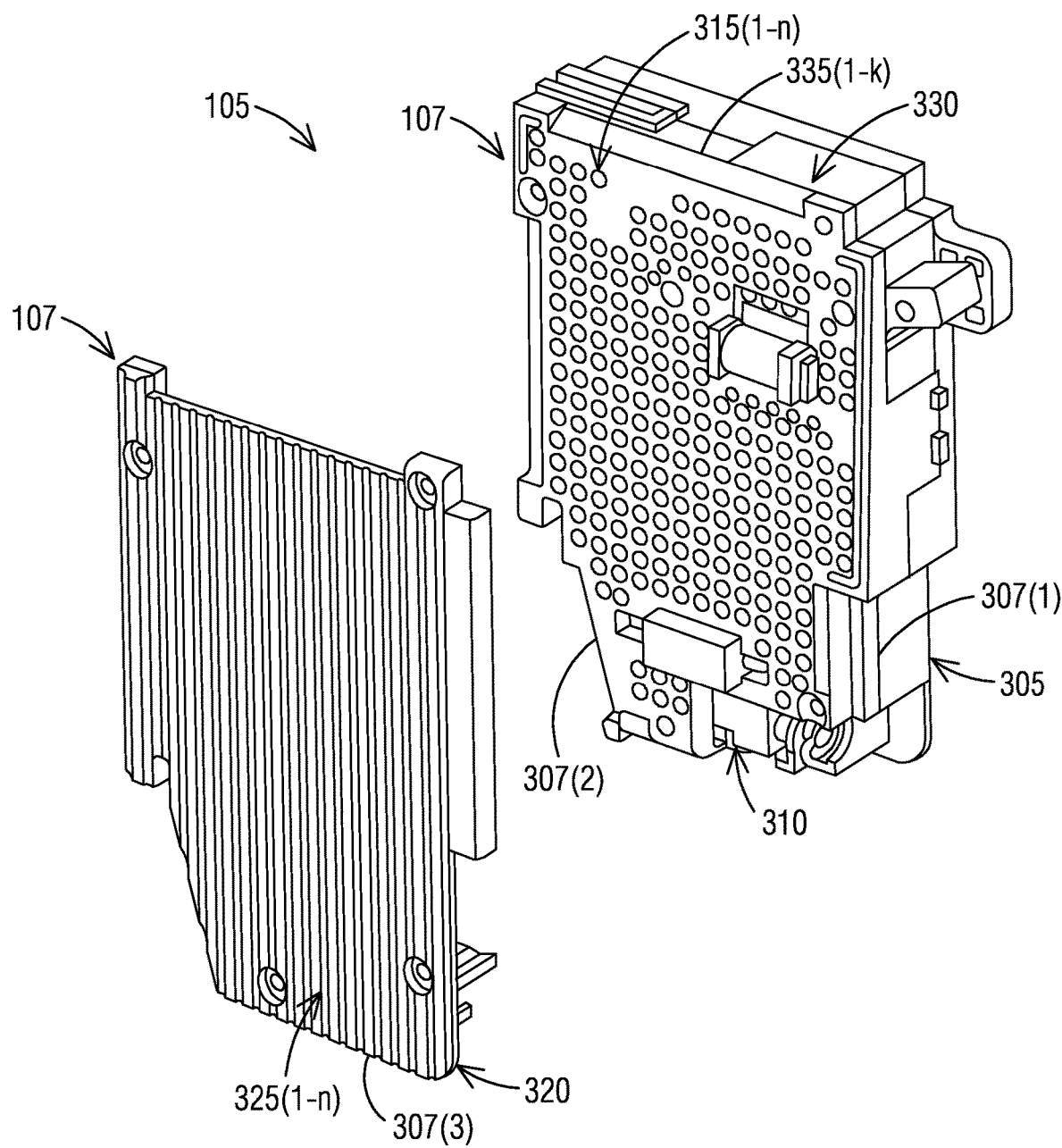
FIG. 3 illustrates an exploded view of a solid-state circuit breaker with an integrated ventilation system in accordance with an exemplary embodiment of the present invention.

Turning now to FIG. 3, it illustrates an exploded view of the solid-state circuit breaker 105 with the integrated ventilation system 107 in accordance with an exemplary embodiment of the present invention. The solid-state circuit breaker 105 comprises a base 305 housing semiconductors, electronics and advanced software algorithms that control power and can interrupt extreme currents faster than traditional moving parts of an electromechanical circuit breaker. The base 305 having a first profile area 307(1). The solid-state circuit breaker 105 comprises the integrated ventilation system 107 for cooling the solid-state circuit breaker 105.

The integrated ventilation system 107 includes a main cover 310 configured to be mounted on the base 305 by covering the first profile area 307(1) of the base 305. The main cover 310 has a second profile area 307(2) such that the second profile area 307(2) has an array of holes 315(1-n) built-in the main cover 310 in that the array of holes 315(1-n) facing perpendicular to a side plane of the solid-state circuit breaker 105. The array of holes 315(1-n) enables heat movement away from electronics of the solid-state circuit breaker 105 to avoid overheating of the electronics within the assembly by ventilating a surface area of the assembly.

The integrated ventilation system 107 includes an outer cover 320 configured to be mounted on the main cover 310 by covering the second profile area 307(2) of the main cover 310 to form an assembly of multi-layered covers as visible in FIGS. 1-2. The outer cover 320 has a third profile area 307(3) such that the third profile area 307(3) has an array of ribs 325(1-m) built-in the outer cover 320 in that the array of ribs 325(1-m) facing an outer plane of the solid-state circuit breaker 105. The array of ribs 325(1-m) is configured to increase a surface area on the outer cover 320 in the outer plane of the solid-state circuit breaker 105. The outer cover 320 has a third profile 330 with a rim having a plurality of slotted openings 335(1-k) to provide channels to ventilate the assembly by enabling heat movement away from the electronics of the solid-state circuit breaker 105.

In one embodiment, the base 305, the main cover 310 and the outer cover 320 may be made of plastic. Alternatively, the base 305 is made of plastic, and the main cover 310 and the outer cover 320 are made of thermally conductive plastic.

The solid-state circuit breaker 105 is configured to be installed in a panel (not shown) of electronic circuit breakers each having a corresponding ventilation system such that ventilation per electronic circuit breaker mitigates the effect of heat from neighboring circuit breakers further thereby reducing concentration of heat within a residential panel. The neighboring circuit breakers can be either fully electronic or hybrid or mechanical only.

Figure 4:
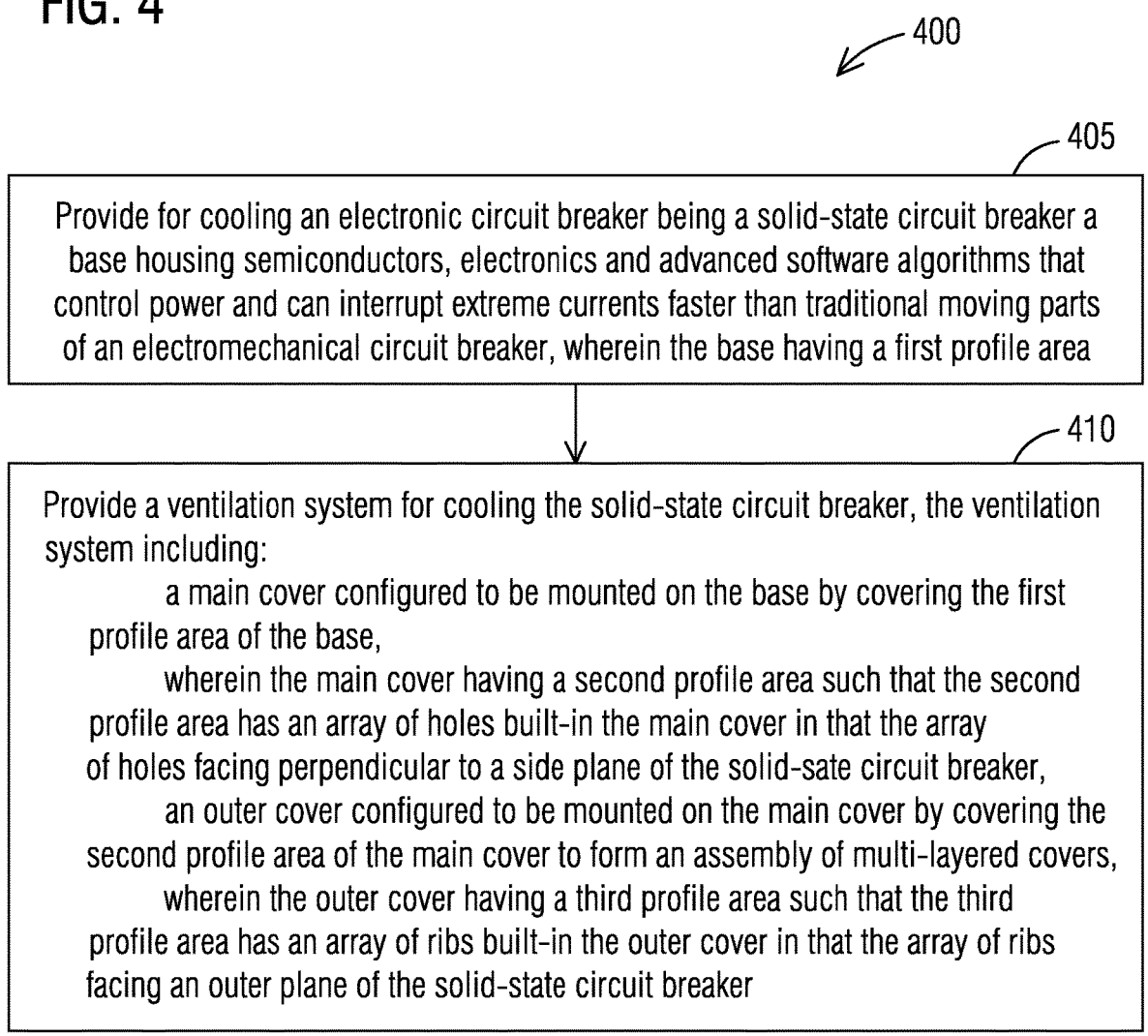
FIG. 4 illustrates a schematic view of a flow chart of a method of cooling an electronic circuit breaker being a solid-state circuit breaker in accordance with an exemplary embodiment of the present invention.

FIG. 4 illustrates a schematic view of a flow chart of a method 400 of cooling an electronic or a residential circuit breaker being the solid-state circuit breaker 105 in accordance with an exemplary embodiment of the present invention. Reference is made to the elements and features described in FIGS. 1-3. It should be appreciated that some steps are not required to be performed in any particular order, and that some steps are optional.

The method 400 comprises a step 405 of providing a base 305 housing semiconductors, electronics and advanced software algorithms that control power and can interrupt extreme currents faster than traditional moving parts of an electromechanical circuit breaker. The base 305 has a first profile area 307(1). The method 400 further comprises a step 410 of providing an integrated ventilation system 107 for cooling the solid-state circuit breaker 105.

The integrated ventilation system 107 includes a main cover 310 configured to be mounted on the base 305 by covering the first profile area 307(1) of the base 305. The main cover 310 has a second profile area 307(2) such that the second profile area 307(2) has an array of holes 315(1-$n$) built-in the main cover 310 in that the array of holes 315(1-$n$) facing perpendicular to a side plane of the solid-state circuit breaker 105.

The integrated ventilation system 107 further includes an outer cover 320 configured to be mounted on the main cover 310 by covering the second profile area 307(2) of the main cover 310 to form an assembly of multi-layered covers. The outer cover 320 has a third profile area 307(3) such that the third profile area 307(3) has an array of ribs 325(1-$m$) built-in the outer cover 320 in that the array of ribs 325(1-$m$) facing an outer plane of the solid-state circuit breaker 105.

While a design of a solid-state circuit breaker is described here a range of one or more other circuit breakers are also contemplated by the present invention. For example, other circuit breakers such as an electronic circuit breaker or a residential circuit breaker may be implemented based on one or more features presented above without deviating from the spirit of the present invention.

The techniques described herein can be particularly useful for a convection feature that provides cooling by utilizing a full side surface of a solid-state circuit breaker. While particular embodiments are described in terms of the full side surface, the techniques described herein are not limited to such designs but can also be used with the partial side surface.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A solid-state circuit breaker, comprising:
   a base housing semiconductors, electronics and advanced software algorithms that control power and can interrupt extreme currents faster than traditional moving parts of an electromechanical circuit breaker, wherein the base having a first profile area; and
   a ventilation system for cooling the solid-state circuit breaker, the ventilation system including:
      a main cover configured to be mounted on the base by covering the first profile area of the base,
      wherein the main cover having a second profile area such that the second profile area has an array of holes built-in the main cover in that the array of holes facing perpendicular to a side plane of the solid-state circuit breaker, and
      an outer cover configured to be mounted on the main cover by covering the second profile area of the main cover to form an assembly of multi-layered covers,
      wherein the outer cover having a third profile area such that the third profile area has an array of ribs built-in the outer cover in that the array of ribs facing an outer plane of the solid-state circuit breaker,
      wherein the solid-state circuit breaker is configured to be installed in a panel of electronic circuit breakers each having a corresponding ventilation system such that ventilation per electronic circuit breaker mitigates the effect of heat from neighboring circuit breakers further thereby reducing concentration of heat within a residential panel, and
      wherein the neighboring circuit breakers can be either fully electronic or hybrid or mechanical only.

2. The solid-state circuit breaker of claim 1, wherein the outer cover having a third profile with a rim having a plurality of slotted openings to provide channels to ventilate the assembly by enabling heat movement away from the electronics of the solid-state circuit breaker.

3. The solid-state circuit breaker of claim 1, wherein the array of ribs is configured to increase a surface area on the outer cover in the outer plane of the solid-state circuit breaker.

4. The solid-state circuit breaker of claim 1, wherein the array of holes enables heat movement away from electronics of the solid-state circuit breaker to avoid overheating of the electronics within the assembly by ventilating a surface area of the assembly.

5. The solid-state circuit breaker of claim 1, wherein substantially entire surface area of the assembly is utilized for maximum cooling efficiency.

6. The solid-state circuit breaker of claim 1, wherein the solid-state circuit breaker is a residential circuit breaker rated for circuits rated either 15 amps or 20 amps.

7. The solid-state circuit breaker of claim 1, wherein the base, the main cover and the outer cover are made of plastic.

8. The solid-state circuit breaker of claim 1, wherein the base is made of plastic, and the main cover and the outer cover are made of thermally conductive plastic.

9. A residential circuit breaker, comprising:
   a base housing electronics and circuits rated either 15 amps or 20 amps, wherein the base having a first profile area; and
   a ventilation system for cooling the residential circuit breaker, the ventilation system including:
      a main cover configured to be mounted on the base by covering the first profile area of the base,
      wherein the main cover having a second profile area such that the second profile area has an array of holes built-in the main cover in that the array of holes facing perpendicular to a side plane of the residential circuit breaker, and
      an outer cover configured to be mounted on the main cover by covering the second profile area of the main cover to form an assembly of multi-layered covers,
      wherein the outer cover having a third profile area such that the third profile area has an array of ribs built-in the outer cover in that the array of ribs facing an outer plane of the residential circuit breaker,
      wherein the residential circuit breaker is configured to be installed in a panel of electronic circuit breakers each having a corresponding ventilation system such that ventilation per electronic circuit breaker mitigates the effect of heat from neighboring electronic circuit breakers further thereby reducing concentration of heat within a residential panel, and
      wherein the neighboring circuit breakers can be either fully electronic or hybrid or mechanical only.

10. The residential circuit breaker of claim 9, wherein the outer cover having a third profile with a rim having a plurality of slotted openings to provide channels to ventilate the assembly by enabling heat movement away from the electronics of the residential circuit breaker.

11. The residential circuit breaker of claim 9, wherein the array of ribs is configured to increase a surface area on the outer cover in the outer plane of the residential circuit breaker.

12. The residential circuit breaker of claim 9, wherein the array of holes enables heat movement away from electronics of the residential circuit breaker to avoid overheating of the electronics within the assembly by ventilating a surface area of the assembly.

13. The residential circuit breaker of claim 9, wherein substantially entire surface area of the assembly is utilized for maximum cooling efficiency.

14. A method of cooling an electronic circuit breaker being a solid-state circuit breaker, the method comprising:
providing a base housing semiconductors, electronics and advanced software algorithms that control power and can interrupt extreme currents faster than traditional moving parts of an electromechanical circuit breaker, wherein the base having a first profile area; and
providing a ventilation system for cooling the solid-state circuit breaker, the ventilation system including:
a main cover configured to be mounted on the base by covering the first profile area of the base,
wherein the main cover having a second profile area such that the second profile area has an array of holes built-in the main cover in that the array of holes facing perpendicular to a side plane of the solid-state circuit breaker, and
an outer cover configured to be mounted on the main cover by covering the second profile area of the main cover to form an assembly of multi-layered covers,
wherein the outer cover having a third profile area such that the third profile area has an array of ribs built-in the outer cover in that the array of ribs facing an outer plane of the solid-state circuit breaker.

15. The method of claim 14, wherein the outer cover having a third profile with a rim having a plurality of slotted openings to provide channels to ventilate the assembly by enabling heat movement away from the electronics of the solid-state circuit breaker.

16. The method of claim 14, wherein the array of ribs is configured to increase a surface area on the outer cover in the outer plane of the solid-state circuit breaker.

17. The method of claim 14, wherein the array of holes enables heat movement away from electronics of the solid-state circuit breaker to avoid overheating of the electronics within the assembly by ventilating a surface area of the assembly.

18. The method of claim 14, wherein substantially entire surface area of the assembly is utilized for maximum cooling efficiency.

19. The method of claim 14, wherein the solid-state circuit breaker is a residential circuit breaker rated for circuits rated either 15 amps or 20 amps.

20. The method of claim 14, wherein the base is made of plastic, and the main cover and the outer cover are made of thermally conductive plastic.

* * * * *